United States Patent [19]

Sysak

[11] 4,341,860
[45] Jul. 27, 1982

[54] PHOTOIMAGING COMPOSITIONS CONTAINING SUBSTITUTED CYCLOHEXADIENONE COMPOUNDS

[75] Inventor: Peter K. Sysak, Wilmington, Del.

[73] Assignee: E. I. Du Pont de Nemours and Company, Wilmington, Del.

[21] Appl. No.: 271,241

[22] Filed: Jun. 8, 1981

[51] Int. Cl.³ ............................ G03C 1/52; G03C 1/68
[52] U.S. Cl. .................................... 430/277; 430/281; 430/286; 430/344; 430/916; 430/925; 430/923; 204/159.23; 159.18
[58] Field of Search ............... 430/281, 286, 344, 916, 430/925, 277, 923; 204/159.23, 159.18

[56] References Cited

U.S. PATENT DOCUMENTS

| | | | |
|---|---|---|---|
| 3,549,367 | 12/1970 | Chang et al. | 430/344 |
| 3,598,592 | 8/1971 | Cescon | 430/281 |
| 4,239,609 | 12/1980 | Barzynski et al. | 430/286 |
| 4,298,678 | 11/1981 | McKeever | 430/344 |

Primary Examiner—Won H. Louie, Jr.

[57] ABSTRACT

Photoimaging compositions comprising (A) a cyclohexadienone compound as defined, and at least one of ($B_1$) a leuco dye or ($B_2$) addition polymerizable ethylenically unsaturated monomer. A polymer binder can be present in the compositions. The new imaging compositions are useful in photoimaging products such as proofing papers, printout papers, overlay films and photopolymerizable elements useful for printing and photoresist purposes. The compositions have improved thermal stability.

17 Claims, No Drawings

PHOTOIMAGING COMPOSITIONS CONTAINING SUBSTITUTED CYCLOHEXADIENONE COMPOUNDS

DESCRIPTION

1. Technical Field

This invention relates to new photoimaging compositions. More particular, this invention relates to photoimaging compositions containing substituted cyclohexadienone compounds.

2. Background Art

Photoimaging compositions utilizing either a leuco dye and/or an addition polymerizable ethylenically unsaturated compound in conjunction with hexaarylbiimidazole compounds are known. Such compositions have been particularly useful in the preparation of proofing papers or in photopolymerizable elements depending on their formulation. Two hexaarylbiimidazole compounds commonly used in these formulations are 2,2'-bis(o-chlorophenyl)-4,4',5,5'-tetrakis-(m-methoxyphenyl)-biimidazole and 2,2'-bis(-chlorophenyl)-4,4',5,5'-tetraphenylbiimidazole. These compositions, while advantageous in many respects, do not possess the degree of thermal stability that is desired to prevent color formation of films or elements during extended storage periods.

It is desirable that photoimaging compositions be prepared that possess the advantages of previous photoimaging compositions and, in addition, exhibit improved thermal staility and flexibility.

DISCLOSURE OF THE INVENTION

In accordance with this invenion there is provided a photoimaging composition comprising an admixture of
(A) a cyclohexadienone compound of the formula:

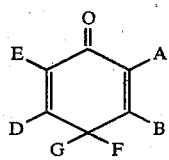

wherein each of A, B, D and E can be hydrogen, an alkyl group pf 1 to 9 carbon atoms, bromo, chloro, an aryl group of 6 to 10 carbon atoms, an aralkyl group wherein the aryl moiety is of 6 to 10 carbon atoms and the alkyl moiety is of 1 to 5 carbon atoms, an alkaryl group wherein the aryl moiety is of 6 to 10 carbon atoms and the alkyl moiety is of 1 to 5 carbon atoms, an alkoxy group of 1 to 4 carbon atoms, and A and B and D and E when taken together may form a benzene ring; F is $CCl_3$ or $CHCl_2$; and G can be an alkyl group of 1 to 18 carbon atoms and an aryl group of 6 to 10 carbon atoms; and at least one compound taken from the group consisting of ($B_1$) a leuco dye that is oxidizable to dye by the cyclohexadienone compound; and ($B_2$) an addition polymerizable ethylenically unsaturated monomeric compound.

The photoimaging compositions of the invention comprise the specific cyclohexadienone compounds and either a dye in its leuco form, or, in the event that the composition is photopolymerizable, a compound having ethylenic unsaturation . Both the leuco dye and ethylenically unsaturated compound can be present in the composition as noted below. A particularly useful additive is Michler's ketone or a derivative thereof which improves printout image enhancement. It is also desirable to add to the photoimaging composition at least one film-forming polymeric binder. Suitable inert solvents are generally present in preparing the formulations. Plasticizers are commonly present in addition to the ethylenically unsaturated monomeric compounds. Additionally components which can be present include: anit-blocking agents, dyes, and white and colored pigments which do not act as sensitizers, etc.

In the photopolymerizable compositions, in addition to the cyclohexadienone compound, addition polymerizable ethylenically unsaturated compound and optional leuco dye and film-forming polymeric binder, there can be present inert solvents, plasticizers, inhibitors, anti-blocking agents, ultraviolet absorbers, oxygen scavengers, chain transfer agents, energy-transfer dyes, etc.

It has been found useful, e.g., for purposes of image enhancement, to have optionally present in the photoimaging compositions a para-aminophenyl ketone of the formula:

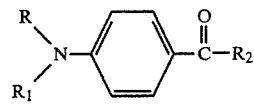

wherein R and $R_1$ can be hydrogen or an alkyl group of 1 to 4 carbon atoms, and $R_2$ can be an alkyl group of 1 to 4 carbon atoms, monocarbocyclic aryl, preferably phenyl; or a $RR_1N$ phenyl group. The p-aminophenyl ketone may be present in an amount of about $10^{-3}$ and 10.0 and preferably $10^{-3}$ to 2.0 moles per mole of cyclohexadienone compound. Preferred compounds include: Michler's ketone (4,4'-bis(dimethylamino)-benzophenone) and ethyl Michler's ketone (4,4'-bis(diethylamino)benzophenone). Other useful p-aminophenyl ketones are disclosed in Fishman U.S. Pat. No. 3,552,973, which is incorporated by reference. The arylthioketones disclosed in Fan U.S. Pat. No. 3,558,322, which is incorporated by reference, are also useful.

After imagewise exposure an image pattern can be observed in the photopolymerizable composition (in layer form) by toning with a colored toner or pigment or by solvent washout.

The cyclohexadienone compounds useful in the photoimaging compositions are defined above. The following list names many of these compound. Useful -4-trichloromethyl-2,5 cyclohexadienone compounds are:
4-methyl-4-trichloromethyl-2,5-cyclohexadienone
2,6-dimethyl-4-trichloromethyl-2,5-cyclohexadienone
3,4-dimethyl-4-trichloromethyl-2,5-cyclohexadienone
4-nonyl-4-trichloromethyl-2,5-cyclohexadienone
4-trichloromethyl-3,4,5-trimethyl-2,5-cyclohexadienone
2,6-di-(t-butyl)-4-trichloromethyl-2,5-cyclohexadienone
2,6-di(t-butyl)-4-methyl-4-trichloromethyl-2,5-cyclohexadienone
2,6-dichloro-4-methyl-4-trichloromethyl-2,5-cyclohexadienone
2,6-dibromo-4-methyl-4-trichloromethyl-2,5-cyclohexadienone
2,4-dimethyl-4-trichloromethyl-2,5-cyclohexadienone 4-trichloromethyl-2,4,5-trimethyl-2,5-cyclohexadienone
4-phenyl-4-trichloromethyl-2,5-cyclohexadienone
2-methoxy-4-methyl-4-trichloromethyl-2,5-cyclohexadienone
2,6-dimethoxy-4-methyl-4-trichloromethyl-2,5-cyclohexadienone
2,3-benzo-4-methyl-4-trichloromethyl-2,5-cyclohexadienone
2,4,6-tri(t-butyl)-4-trichloromethyl-2,5-cyclohexadienone
4-trichloromethyl-2,4,6-trimethyl-2,5-cyclohexadienone
4-t-butyl-4-trichloromethyl-2,5-cyclohexadienone
2,3,4,5,6-pentamethyl-4-trichloromethyl-2,5-cyclohexadienone
2,4,6-tri (t-pentyl)-4-trichloromethyl-2,5-cyclohexadienone
4-benzyl-4-trichloromethyl-2,5-cyclohexadienone
2-t-butyl-4-trichloromethyl-2,5-cyclohexadienone
2-i-propyl-4-methyl-4-trichloromethyl-2,5-cyclohexadiene
2-t-butyl-4-methyl-4-trichloromethyl-2,5-cyclohexadienone
2-ethyl-4,5-dimethyl-4-trichloromethyl-2,5-cyclohexadienone
2,3-benzo-4,5-dimethyl-4-trichloromethyl-2,5-cyclohexadienone Additional useful compounds are simila -4-dichloromethyl-2,5-cyclohexadienones.

Hexadienone compounds, in some cases, may be purchased commercially or, where not commercially available, may be made by procedures disclosed in the literature: M. S. Newman and L. L. Wood, Jr., *J. Amer. Chem. Soc.*, 81 6450 (1959); V. P. Vitullo and E. A. Logue, *ibid* 98 5906 (1976); M. S. Newman and A. G. Pinkus, *J. Org. Chem.* 19 978 (1954).

The leuco form of the dye, which comprises one component of a photoimaging composition of the present invention, is the reduced form of the dye having one or two hydrogen atoms, the removal of which together with an additional electron in certain cases produces the dye, i.e., a differently colored compound. Generally when the leuco form has only one removable hydrogen and the resultant dye is cationic, then there is also present a mineral acid, organic acid, or acid-supplying compound which forms a salt with the leuco form of the dye. Such dyes have been described, for example, in U.S. Pat. No. 3,445,234, column 2, line 49 to column 8, line 55, incorporated by reference. The following classes are included:

(a) aminotriarylmethanes
(b) aminoxanthenes
(c) aminothioxanthenes
(d) amino-9,10-dihydroacridines
(e) aminophenoxazines
(f) aminophenothiazines
(g) aminodihydrophenazines
(h) aminodiphenylmethanes
(i) leuco indamines
(j) aminohydrocinnamic acids (cyanoethanes, leuco methines)
(k) hydrazines
(l) leuco indigoid dyes
(m) amino-2,3-dihydroathraquinones
(n) tetrahalo-p,p'-biphenols
(o) 2(p-hydroxyphenyl)-4,5-diphenylimidazoles
(p) phenethylanilines Of these leuco forms, (a) through (i) form the dye by losing one hydrogen atom, while the leuco forms (j) through (p) lose two hydrogen atoms to produce the parent dye. Aminotriarylmethanes are preferred. A general preferred aminotriarylmethane class is that of the acid salts of aminotriarylmethanes wherein at least two of the aryl groups are phenyl groups having (a) an $R_1R_2N$-substituent in the position para to the bond to the methane carbon atom wherein $R_1$ and $R_2$ are each groups selected from hydrogen, $C_1$ to $C_{10}$ alkyl, 2-hydroxyethyl, 2-cyano-ethyl, or benzyl and (b) a group ortho to the methane carbon atom which is selected from lower alkyl (C is 1 to 4), lower alkoxy (C is 1 to 4), fluorine, chlorine or bromine; and the third aryl group may be the same as or different from the first two, and when different is selected from (a) Phenyl which can be substituted with lower alkyl, lower alkoxy, chloro, diphenylamino, cyano, nitro, hydroxy, fluoro or bromo;
(b) Naphthyl which can be substituted with amino, di-lower alkylamino, alkylamino;
(c) Pyridyl which can be substituted with alkyl;
(d) Quinolyl;
(e) Indolinylidene which can be substituted with alkyl.

Preferably, $R_1$ and $R_2$ are hydrogen or alkyl of 1 to 4 carbon atoms.

With the leuco form of dyes which have amino or substituted amino groups within the dye structure and which are characterized as cationic dyes, an amine salt-forming mineral acid, organic acid, or an acid from a compound supplying acid is employed. The amount of acid usually varies from 0.33 mol to 1 mol per mol of amino nitrogen in the dye. The preferred quantity of acid is about 0.5 to 0.9 mol per mol of amino nitrogen. Representative acids which form the required amine salts are hydrochloric, hydrobromic, sulfuric, phosphoric, acetic, oxalic, p-toluenesulfonic, trichloroacetic, trifluoroacetic and perfluoroheptanoic acid. Other acids such as acids in the "Lewis" sense or acid sources which may be employed in the presence of water or moisture include zinc chloride, zinc bromide, and ferric chloride. Representative leuco dye salts include tris-(4-diethylamino-o-tolyl) methane zinc chloride, tris-(4-diethylamino-o-tolyl) methane oxalate, tris-(4-diethylamino-o-tolyl) methane p-toluene-sulfonate, etc.

Optionally, other additives can be present in the photoimaging composition. Polymeric binders can be added to thicken the formulations or adhere them to substrates. The binders can also serve as a matrix for the color-forming composition. Light-transparent and film-forming polymers are preferred. Examples are ethyl cellulose, polyvinyl alcohol, polyvinyl chloride, polystyrene, polyvinyl acetate, poly-(methyl, propyl or butyl methacrylate), cellulose acetate, cellulose butyrate, cellulose acetate butyrate, cellulose nitrate, chlorinated rubber, copolymers of the above vinyl monomers, etc.

The binder composition can also contain inert infusible fillers such as titanium dioxide, organophilic colloidal silica, bentonite, powdered glass, micron-sized alumina and mice in minor, noninterfering amounts. Formulations containing micron-sized silicas, as, for example, the "Syloid" silica gls, sold by W. R. Grace & Co., are particularly useful for providing a "tooth" for pencil or ink receptivity and eliminating blocking tendencies.

With some polymers, it is desirable to add a plasticizer, e.g., solid or liquid, to give flexibility to the film or coating. Suitable plasticizers are disclosed in U.S.

Pat. No. 3,658,543, column 10, lines 20 to 73, incorporated by reference. A preferred liquid plasticizer is Nonylphenoxypoly(ethyleneoxy)-ethanol. A preferred solid plasticizer is N-ethyl-p-toluenesulfonamide. The plasticizers can be used in concentration ranging from 1:20 to 5:3, preferably 1:5 to 1:2, based on the weight of polymeric binder used.

In preparing the formulation generally inert solvents are employed which are volatile at ordinary pressures. Examples include alcohols, e.g., methanol, ethanol, 1-propanol, 2-propanol, butanol, and ethylene glycol; ether alcohols, e.g., 2-ethoxy ethanol, 2-butoxy ethanol and diethylene glycol monomethyl ether; esters, e.g., methyl acetate and ethyl acetate; aromatics, e.g., benzene, o-dichlorobenzene and toluene; ketones, e.g., acetone, methyl ethyl ketone and 3-pentanone; aliphatic halocarbons, e.g., methylene chloride, chloroform, 1,1,2-trichloroethane, 1,1,2,2-tetrachloroethane and 1,1,2-trichloroethylene; miscellaneous solvents, e.g., dimethylsulfoxide, pyridine, tetrahydrofuran, dioxane, dicyanocyclobutane and 1-methyl-2-oxo-hexamethyleneimine; and mixtures of these solvents in various proportions as may be required to attain solutions. If is often beneficial to leave a small residue of solvent in the dried composition so that the desired degree of imaging can be obtained upon subsequent irradiation.

Useful optional antiblocking agents present to prevent the coatings from adhering to one another include:

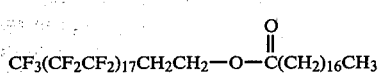

and other known agents.

In the photopolymerizable embodiment of this invention, in addition to the cyclohexadienone compounds described above, at least one addition polymerizable ethylenically unsaturated compound having at least one polymerizable ethylenic group is present. Such compounds are capable of forming a high polymer by free-radical initiated, chain propagating, addition polymerization. Generally, polymeric components (binders) as well as inhibitors are also present in the photopolymerizable composition.

Preferably, the monomeric compound has at least two terminal ethylenically unsaturated groups, e.g., 2 to 4 groups. The monomeric compounds are nongaseous, i.e., at 20° C. and atmospheric pressure, have a normal boiling point about 100° C. and a plasticizing action on any thermoplastic polymeric binder that may be present.

Ethylenically unsaturated monomeric compounds useful in this invention include monomeric compounds or polymers wherein the ethylenic unsaturation is present as an extralinear substituent attached to the polymer backbone.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831 incorporated by reference, 2,2-di(p-hydroxyphenyl)-propane diacrylate, pentaerytrhitol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the composition can also contain at least one of the following free radical-initiated, chain-propagating, addition-polymerizable, ethylenically unsaturated compounds having a molecular weight of at least 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, which is incorporated by reference, e.g., those having a plurality of addition polymerizable ethylenic linkages, particularly when present as terminal linkages. Especially preferred are those wherein at least one and preferably most of such linkages are conjugated with a double-bonded carbon, including carbon double-bonded to carbon and to such herteroatoms as nitrogen, oxygen and sulfur. Outstanding are such materials wherein the ethylenically unsaturated groups, especially the vinylidene groups, are conjugated with ester or amide structures.

Useful polymers having ethylenically unsaturated groups attached thereto are: the polymerizable, ethylenically unsaturated polymers of U.S. Pat. Nos. 3,043,805 and 2,929,710, which are incorporated by reference, e.g., polyvinyl acetate/acrylate, cellulose acetate/acrylate, cellulose acetate/methacrylate, N-acrylyloxymethyl polyamide, etc.; polyoxyethylated trimethylol propane triacrylate, polytetramethylene glycol diacrylate, etc., disclosed in U.S. Pat. No. 3,418,295, which is incorporated by reference.

Suitable thermal polymerization inhibitors that can be used in photopolymerizable compositions include p-methoxyphenol, hydroquinone, and alkyl- and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene. Other useful inhibitors, include p-toluquinone and chloranil, and thiazine dyes, e.g., Thionine Blue G (C.I. Basic Blue 25), and Toluidine Blue O (C.I. Basic Blue 17). Also useful as thermal polymerization inhibitors are the nitroso compositions disclosed in U.S. Pat. No. 4,168,982, which is incorporated by reference. In certain embodiments of the invention containing certain dye photoinitiators, however, no thermal inhibitor is required since these initiators have a dual function and in the dark serve as thermal inhibitors.

Leuco dyes, especially those having at least one dialkylamino group, are useful additives to produce a print-out image where it is desired to identify polymerized areas. Also a leuco triphenylamine dye or various salts of the dye, e.g., the HCl salt of the leuco blue dye can be used. Illustrations of suitable dyes include tris-(4-N,N-diethyl-amino-o-tolyl)-methane trihydrochloride, bis(4-N,N-diethylamino-o-tolyl)triphenylmethane, bis(4-N,N-diethylamino-o-tolyl) methylenedioxyphenylmethane, leuco neutral shade dye, i.e., bis(4-N,N-diethylamino-o-tolyl)-benzyl thiophenylmethane, Leuco Malachite Green (C.I. Basic Green 4), leuco forms of Crystal Violet, Brilliant Green (C.I. Basic Green 1), Victorial Green 3B (C.I. Basic Green 4), Acid Green GG (C.I. Acid Green 3), Methyl Violet (C.I. Basic Violet 1), Rosaniline (C.I. Basic Violet 14), etc. The salt forms, e.g., HCl salt, salts with Lewis acid, sulfuric acid salts, p-toluene sulfonic acid salts, etc., of the leuco dye is preferred for use. The leuco dye, when used is generally present in a mole ratio of leuco dye to the cyclohexadienone compound of 0.1 to 10.

Suitable film-forming polymeric organic binders which can be present in the photopolymerizable photoimaging composition as the sole binder or in combination with others include: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having number average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate, succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

The binder can contain sufficient acidic or other groups to render the composition processible in aqueous developer. Useful aqueous-processible binders include those disclosed in U.S. Pat. No. 3,458,311 and in U.K. Pat. No. 1,507,704, which are incorporated by reference. Useful amphoteric polymers include interpolymers derived from N-alkylacrylamides or methacrylamides, acidic film-forming comonomer and an alkyl or hydroxyalkyl acrylate such as those disclosed in U.S. Pat. No. 3,927,199, which is incorporated by reference.

Useful solvents, plasticizers, e.g., 10 to 50 percent by weight based on the weight of monomer, inhibitors and antiblocking agents, have been described previously above. Examples of suitable ultraviolet radiation absorbing materials are disclosed in U.S. Pat. No. 3,854,950, columns 3 and 4, incorporated by reference: 2,2'-dihydroxy-4-methoxybenzophenone is a preferred material. Oxygen scavengers, e.g., 2-allyl thiourea, stannous chloride, N-phenylglycine, etc. can be present. This type compound appears to eliminate or reduce the induction period usually found in a photopolymerizable reaction, possibly by consumption of oxygen in the layer prior to exposure.

In the photoimaging compositions the cyclohexadienone compound is present in an amount of about 0.01 to 90 percent by weight of solids and the leuco dye is present in about 99.99 to 10 percent by wieght of solids. Preferably a polymeric binder is present in the photoimaging compositions, for example, in an amount up to 99.9% by weight based on the total weight of cyclohexadienone compound, leuco dye and polymeric binder. Generally the leuco dye comprises 0.1–5.0% by weight and the cyclohexadienone compound comprises 0.01–10.0% by weight of the photoimaging composition, and binder is present in amounts of 0.5–200 parts by weight per combined parts of leuco dye and cyclohexadienone compound.

In the photopolymerizable composition embodiment of this invention the cyclohexadienone compound and leuco dyes and Michler's ketone type compounds, when used, are present in the quantity ranges set forth above. The monomeric compound and polymeric binder are present in the photoimaging composition in from 1 to 90 and 1 to 90% by weight, respectively. 0.001 To 2.0 parts by weight per 100 parts by weight of monomer and binder of a thermal polymerization inhibitor is preferably present.

For imaging uses, the compositions of this invention may be coated upon or impregnated in substrates following known techniques. Substrates include materials commonly used in the graphic arts and in decorative applications such as paper ranging from tissue paper to heavy cardboard, films of plastics and polymeric materials such as regenerated cellulose, cellulose acetate, cellulose nitrate, polyethylene terephthalate, vinyl polymers and copolymers, polyethylene, polyvinyl-acetate, polymethyl methacrylate, polyvinylchloride; textile fabrics; glass, wood and metals. The composition, usually as a solution in a carrier solvent described above, may be sprayed, brushed, applied by a roller or an immersion coater, flowed over the surface, picked up by immersion or spread by other means, and the solvent evaporated.

Any convenient source providing radiation of wavelengths in the range of 200 nm to 420 nm can be used to activate the photoimaging composition for image formation and photopolymerization initiation. The radiation may be natural or artificial, monochromatic or polychromatic, incoherent or coherent, and should be sufficiently intense to activate a substantial proportion of the photoinitiator.

Conventional light sources include fluorescent lamps, mercury, metal additive and arc lamps. Coherent light sources are the pulsed nitrogen-, xenon, argon ion- and ionized neon-lasers whose emissions fall within or overlap the ultraviolet or visible absorption bands of the photoinitiator. Ultraviolet and near-visible radiation-emitting cathode ray tubes widely useful in printout systems for writing on photosensitive materials are also useful with the subject compositions.

Images may be formed by writing with a beam of the activating light or by exposing to such light a selected area behind a negative, stencil, or other relatively opaque pattern. The negative may be silver on cellulose acetate or polyester film or one in which its opacity results from aggregations of areas having different refractive indices. Image formation may also be effected in conventional diazo printing apparatus, graphic arts exposure or electronic flash equipment and by projection as described in U.S. Pat. No. 3,661,461. The light exposure time may vary from a fraction of a second to several minutes, depending upon the intensity and spectral energy distribution of the light, its distance from the composition, the nature and amount of the composition available, and the intensity of color in the image desired.

BEST MODE FOR CARRYING OUT THE INVENTION

The best mode for a print-out photoimaging composition is illustrated in Example 3, wherein the cyclohexadienone compound is 4-methyl-4-trichloromethyl-2,5-cyclohexadienone and also Michler's ketone is included as a sensitizer. The best mode for a photoimaging composition containing an ethylenically unsaturated monomeric compound is shown in Example 5 (Element I), wherein the cyclohexadienone compound is 4-methyl-4-trichloromethyl-2,5-cyclohexadienone and also Michler's ketone is included as a sensitizer.

INDUSTRIAL APPLICABILITY

The photoimaging compositions containing the cyclohexadienone compounds described herein are useful in various photoimaging formulations which are particularly advantageous in having excellent thermal stability. A strong color image is formed upon exposure even after an extended storage period. The formulations containing cyclohexadienone compounds as defined are used in dual response photoimaging products, where controlled sequential exposure with ultraviolet and visible light may yield negative or positive images, e.g., Dylux ® proofing papers, printout papers, e.g., for the Du Pont "aca" automatic clinical analyzer, overlay films, etc.; and in photopolymerizable layers and elements useful for printing purposes as well as a variety of copying, e.g., office copying, recording, decorative, and photoresist applications.

EXAMPLES

The following procedures and examples illustrate the invention wherein the parts and percentages are by weight.

SYNTHESIS OF CYCLOHEXADIENONE COMPOUNDS

Two compounds, 4-methyl-4-trichloromethyl-2,5-cyclohexadienone (TMCH), and 4-dichloromethyl-4-methyl-2,5-cyclohexadienone (DMCH), can be purchased from Frinton Laboratories, Vineland, N.J.

TMCH and its various substituted derivatives are prepared by the reaction of the appropriately substituted phenol with carbon tetrachloride and aluminum chloride according to the procedures of M. S. Newman and L. L. Wood, Jr. described in *J. Amer. Chem. Soc.*, 81 6450 (1959). Those with ordinary skill in the art of organic synthesis may wish to make suitable modifications in the methods used to purify the products, eg., the use of crystallization or chromatographic procedures in place of the steam distillation employed in the literature cited above. The compounds 2,5-dichloro- and 2,5-dibromo-2,5-cyclohexadienone are prepared in similar fashion (M. S. Newman and A. G. Pinkus, *J. Org. Chem.*, 19, 978 (1954) or, in higher yield, by addition of chlorine or bromine to the parent compound TMCH followed by dehydrohalogenation according to K. V. Auwers and W. Julicher, *Ber*, 55, 2167 (1922).

DMCH and its substituted derivatives are prepared by the reaction of the appropriate substituted phenol with chloroform and aqueous sodium hydroxide according to procedures described in the literature; V. P. Vitullo and E. A. Logue, *J. Amer. Chem. Soc.*, 98, 5960 (1976); M. S. Newman and W. X. Bajzer, *J. Org. Chem.*, 35, 270 (1970); K. V. Auwers and G. Keil, *Ber.*, 35, 4207 (1902); R. C. Fuson and T. G. Miller, *J. Org. Chem.*, 17, 316 (1952).

EXAMPLE 1

This example demonstrates photoimaging through oxidation of leuco dyes by the cyclohexadienone compounds.

Coating compositions are made containing poly(methylmethacrylate) (1 g), a leuco dye (0.27 mmole), a cyclohexadienone (0.44 mmole), and acetone (12 ml). The compositions are coated with a 0.003 inch (0.0076 cm) doctor knife on a 0.001 inch (0.0025 cm) poly(ethyleneterephthalate) support film and dried in air at ambient temperature. The films are exposed through a protective cover sheet of 0.001 inch (0.0025 cm) poly(ethyleneterephthalate) and a 20-step $\sqrt[3]{2}$ neutral density transmission gray scale for 15 minutes to a 2 kw mercury photopolymer lamp in a Berkey-Ascor ® 30×40 Vacuum Printer.

The results in Table 1 show the generation of colored images in those elements which contain the cyclohexadienone compound and a leuco dye. The fastest elements show the highest number of colored steps and the highest Dmax (measured with white light on a Macbeth Quantalog ® densitometer).

TABLE I

| Leuco Dye | Cyclo-hexadienone | Colored Steps | Dmax |
|---|---|---|---|
| LCV | None | 0 | 0 |
| LCV | TMCH | 7 | 0.12 |
| LCV | DMCH | 3 | 0.11 |
| TTM | TMCH | 6 | 0.14 |
| TTM | DMCH | 3 | 0.05 |

LCV: tris(4-dimethylaminophenyl)methane
TTM: tris(4-diethylamino-2-methylphenyl)methane
TMCH: 4-methyl-4-trichloromethyl-2,5-cyclohexadienone
DMCH: 4-dichloromethyl-4-methyl-2,5-cyclohexadienone

EXAMPLE 2

This example illustrates the presence of Michler's ketone sensitizer during the photooxidation of leuco dyes by the cyclohexadienone compounds.

Photosensitive coatings are prepared as described in Example 1 using as the leuco dye, tris(4-dimethylaminophenyl) methane (LCV). The cyclohexadienone compounds are as described in Example 1. In some coatings 0.037 mmole of Michler's ketone (MK) is added. Exposures are made as described in Example 1. The results in Table II show a higher number of colored steps and higher optical density (Dmax) is obtained when Michler's ketone is present with the cyclohexadienone compound.

TABLE II

| Cyclo-hexadienone | Michler's ketone | Visible Steps | Dmax |
|---|---|---|---|
| None | Yes | 0 | 0 |
| TMCH | No | 7 | 0.12 |
| TMCH | Yes | 14 | 0.58 |
| DMCH | No | 3 | 0.11 |
| DMCH | Yes | 13 | 0.37 |

EXAMPLE 3

This example illustrates the results achieved with compositions containing cyclohexadienone compounds of the invention as compared to control compositions containing hexaarylbiimidazole compounds.

Photosensitive coating compositions are prepared containing poly(methylmethacrylate) (1g), the leuco dye described in Example 2 (0.27 mmole), acetone (12 ml) and the amounts of the Michler's ketone and TMCH (See Example 1) and (2,2'-bis(o-chlorophenyl)-4,4',5,5'-tetrakis(m-methoxyphenyl)-biimidazole (CDM) set forth in Table III below. The elements are exposed and evaluated as described in Example 1. The results in Table III show a higher number of colored steps and higher optical density (Dmax) for the compositions containing the cyclohexadienone compound (including Michler's ketone) when compared with compositions containing the hexaarylbiimidazole initiator alone.

TABLE III

| Michler's ketone (mmole) | TMCH (mmole) | CDM (mmole) | Colored Steps | Dmax |
|---|---|---|---|---|
| 0 | 0 | 0.44 | 6 | 0.09 |
| 0 | 0.44 | 0 | 7 | 0.12 |
| 0.037 | 0 | 0.44 | 7 | 0.10 |
| 0.037 | 0.44 | 0 | 14 | 0.58 |

EXAMPLE 4

This example illustrates initiation of photopolymerization by cyclohexadienone compounds of this invention.

Photopolymer compositions are prepared containing poly(methylmethacrylate) 10 g of a 10 wt. % solution in acetone), triethyleneglycol diacrylate (1.3 g), Michler's ketone (0.010 g) and the cyclohexadienone compounds (0.59 mmole) listed in Table IV. These compositions are coated with a 0.0025 inch (0.0064 cm) doctor knife on a support of 0.001 inch (0.0025 cm) poly(ethyleneterephthalate), are dried in air at ambient temperature, and are covered with film sheets the same as the support. The elements are exposed through the cover sheet and a 30-step $^3\sqrt{2}$ neutral density transmission gray scale by means of a 2 kw xenon lamp in a nuArc ® "Flip Top" platemaker. The cover sheets are removed from the exposed element, and the photopolymer layers are each dusted with a Cromalin ® 4/C black toner. Cromalin ® is a trademark of E. I. du Pont de Nemours and Company. The polymerized areas are nontacky and resist toning. In Table IV photopolymerization speed is indicated by the number of steps ("clear steps") which are sufficiently polymerized to remain untoned. It can be seen that ring-substitution of the cyclohexadienone by alkyl groups is permissible while still giving good photopolymerization speed.

TABLE IV

| Cyclohexadienone | Clear Steps |
|---|---|
| 4-methyl-4-trichloromethyl-2,5-cyclohexadienone | 15 |
| 3,4-dimethyl-4-trichloromethyl-2,5-cyclohexadienone | 14 |
| 2,6-di(tert butyl)4-methyl-4-trichloromethyl-2,5-cyclohexadienone | 10 |

EXAMPLE 5

This example illustrates the improvement in the printout image and photopolymerization of compositions containing cyclohexadienone compounds of this invention.

Photopolymer compositions are prepared from poly(methylmethacrylate) (1 g), triethyleneglycol diacrylate (1.3 g), acetone (12 ml) and the amounts of initiators, Michler's ketone (MK) and leuco dye described in Example 1 as indicated in Table V. These compositions are coated with a 0.003 inch (0.0076 cm) doctor knife on a 0.001 inch (0.0025 cm) poly(ethyleneterephthalate) support, air-dried at ambient temperature, and covered with a similar piece of poly(ethyleneterephthalate).

Element samples are exposed through the cover sheet and through a 30-step $^3\sqrt{2}$ neutral density transmission gray scale to a 2 kw mercury photopolymer lamp in a Berkey-Ascor ® Vacuum Printer described in Example 1. Some samples show a printout image for which is recorded the highest step number and the optical density of step 1 (Dmax), measured with a Macbeth Quantalog ® densitometer. To measure the extent of polymerization, the cover sheet is removed from the exposed elements, and the photopolymer layer is dusted with a toner as described in Example 4. Toner adheres to tacky, unpolymerized areas but not to the polymerized areas. Photopolymerization speed is recorded as the highest number of steps which resist toning (clear steps).

Elements which contain the cyclohexadienone initiators, Michler's ketone as a sensitizer, and leuco dye (elements I, M) show a better combination of printout image and photopolymerization speed than the other compositions tested. The combination cyclohexadienone and leuco dye (elements G, K) give better printout images and photopolymerization speed than the combination of hexaarylbiimidazole compound leuco dye (element D), and a better printout image with comparable photopolymerization speed as the combination of Michler's ketone and leuco dye (element B). The data in Table V emphasize the synergistic effect of Michler's ketone on the cyclohexadienones with respect to photopolymerization (element H vs. F+A; element L vs.

J+A) or printout dye image (element I vs. G; element M vs. K). The printout image density (Dmax) of the combination of TMCH with Michler's ketone and leuco dye (film I) surpasses the printout density (Dmax) of the combination of hexaarylbiimidazole compound with Michler's ketone and leuco dye (element E) while the photopolymerization speed of these elements is almost identical.

number of polymerized steps remaining on the board is recorded. Table VI shows that the photopolymerization speed (the number of polymerized steps) of the resists containing TMCH is equal to or higher than the speed of the resists containing CBP.

TABLE V

| Element Sample | Initiator Type | Composition (mmole) Initiator | Michler's ketone | LCV | Printout Image[1] No. of Steps | Dmax | Toned Image[2] Clear Steps |
|---|---|---|---|---|---|---|---|
| A | MK | — | 0.037 | — | — None | — | 18 (10) |
| B | MK/LCV | — | 0.037 | 0.27 | V. Faint | — | 10 (5) |
| C | MK/CDM | 0.44 CDM | 0.037 | — | — None | — | 25 (11) |
| D | CDM/LCV | 0.44 CDM | — | 0.27 | — None | — | 0 (0) |
| E | MK/CDM/LCV | 0.44 CDM | 0.037 | 0.27 | 24 | 0.46 | 24 (16) |
| F | TMCH | 0.44 TMCH | — | — | — None | — | 2 (0) |
| G | TMCH/LCV | 0.44 TMCH | — | 0.27 | 10 | 0.30 | 10 (4) |
| H | MK/TMCH | 0.44 TMCH | 0.037 | — | — None | — | 30+ (22) |
| I | MK/TMCH/LCV | 0.44 TMCH | 0.037 | 0.27 | 20 | 0.90 | 22 (16) |
| J | DMCH | 0.44 DMCH | — | — | — None | — | 3 (0) |
| K | DMCH/LCV | 0.44 DMCH | — | 0.27 | 7 | 0.25 | 8 (1) |
| L | MK/DMCH | 0.44 DMCH | 0.037 | — | — None | — | 30+ (22) |
| M | MK/DMCH/LCV | 0.44 DMCH | 0.037 | 0.27 | 15 | 0.74 | 19 (11) |

[1]Exposed 15 minutes
[2]Values in parenthesis are for 3-minute exposures; other values are for 15-minute exposures

EXAMPLE 6

This example illustrates photopolymerization of a photoresist composition initiated by cyclohexadienone compounds.

A coating composition stock is prepared by roll-milling the following ingredients together overnight:

| Ingredient | Amount (g) |
|---|---|
| Pentaerythritol triacrylate | 50.0 |
| Poly(methylmethacrylate(34)/styrene(42)/acrylonitrile(8.5)/butadiene(15.5) | 66.4 |
| Poly(methylmethacrylate(96)/ethylacrylate(4) inherent viscosity is 0.54[1] | 20.4 |
| Bis-methacrylate ester from the bis-glycidyl ether of bisphenol-A | 50.0 |
| Methylene chloride | 300.0 |
| Monastral Green (C.I. Pigment Green 7) | 0.24 |

[1]Inherent viscosity of a solution containing 0.25 g polymer in 50 ml methylene chloride measured at 20° C. using a No. 50 Cannon Fiske Viscometer.

To 40 g-aliquots of the stock are added 80 mg (0.30 mmole) Michler's ketone and the amounts of initiators, 4-methyl-4-trichloromethyl-2,5-cyclohexadienone (TMCH) or 4-chlorobenzophenone (CBP) indicated in Table VI. The final compositions are coated on 0.001 inch (0.0025 cm) poly(ethyleneterephthalate) support with a 0.016 inch (0.041 cm) doctor and air-dried at ambient temperature to a dry thickness of about 0.004 inch (0.010 cm). The element is laminated at room temperature (roller pressure) to a copper-plated phenolic circuit-board stock. The laminates are heated 2 minutes at 120° C. in an oven and again passed through the roller laminator. The laminates are cooled at room temperature for one-half an hour then exposed through the polyester support and through a 20-step $^3\sqrt{2}$ neutral density transmission gray scale for 5 minutes to a 2 kw xenon light source in a nuArc® "Flip Top" Platemaker. The polyester support is peeled off the exposed laminate and unpolymerized resist is washed off the copper surface for 2 minutes with 1,1,1-trichloroethane in a Riston® 1A Processor manufactured by E. I. duPont de Nemours and Company, Wilmington, Del. The

TABLE VI

| Initiator | Polymerized Steps |
|---|---|
| TMCH (80 mg; 0.35 mmole) | 12 |
| CBP (80 mg; 0.37 mmole) | 7 |
| TMCH (480 mg; 2.13 mmole) | 15 |
| CPB (480 mg; 2.20 mmole) | 15 |

EXAMPLE 7

This example illustrates the results achieved using various sensitizers in combination with cyclohexadienone compounds of the invention.

Photopolymer compositions are made containing triethyleneglycol diacrylate (1.3 g), a 10% by weight solution of poly(methymethacrylate) in acetone (10 g), 4-methyl-4-trichloromethyl-2,5-cyclohexadienone (101 mg; 0.45 mmole) and the appropriate sensitizer (0.04 mmole) set forth in Table VII below. The compositions are coated, covered, exposed, toned and evaluated as described in Example 4. The results in Table VII show that, of the compounds tested, Michler's ketone gives the greatest number of polymerized steps for the shortest exposure time.

TABLE VII

| Sensitizer | Exposure Time(sec) | Clear Steps | Relative Speed |
|---|---|---|---|
| Michler's ketone | 20 | 15 | 1.0 |
| 4-Dimethylaminobenzoin | 15 | 7 | 0.24 |
| 2,5-Bis(4'-diethylamino-2'-methylbenzylidene)cyclopentanone | 15 | 3 | 0.09 |
| 7-Diethylamino-4-methyl coumarin | 60 | 7 | 0.06 |
| 7-(4'-chloro-6'-diethyl-amino-1',3',5'-triazin-4'-yl)amino-3-phenyl coumarin | 300 | 12 | 0.04 |
| 1-Methyl-2-benzoyl-methylene-β-naphthothiazole | 300 | 11 | 0.03 |
| 4-Dimethylaminocinnamaldehyde | 180 | 1 | <0.005 |
| 5-(4'-dimethylaminobenzylidene)rhodanine | 300 | 0 | 0.0002 |

EXAMPLE 8

This example illustrates the formation of a printout image by use of thermally stable compositions containing a leuco quinoline dye and a cyclohexadienone compound of the invention.

A coating composition is prepared containing 5 g of 10% by weight of cellulose acetate butyrate (17% butyrate) in acetone, 50 mg Michler's ketone, 100 mg 4-methyl-4-trichloromethyl-2,5-cyclohexadienone (TMCH) and 100 mg of 4-(4'-dimethylaminostyryl) quinoline. The composition is coated with a 0.0025 inch (0.0064 cm) doctor on 0.001 inch (0.0025 cm) poly(ethyleneterephthalate) and is air dried to form element (A). The resulting yellow element is exposed for about 4 minutes through a 30-step $\sqrt[3]{2}$ neutral density transmission gray scale to a 2 kw mercury lamp in a Berkey-Ascor ® Vacuum Printer described in Example 1. An orange color of decreasing stepwise intensity is formed in steps 1 to 7. Element (A) does not discolor when baked 5 minutes at 100° C., and the baked element performs normally when exposed to light as described above. Two elements are made as described above, but element (B) contains no Michler's ketone, and element (C) contains no TMCH. Neither of the elements (B) or (C) show an orange printout image when exposed as described for element (A).

EXAMPLE 9

This example illustrates improved thermal stability of compositions containing cyclohexadienone compounds of the invention.

Two photopolymer compositions are prepared containing poly(methylmethacrylate) (1 g), triethyleneglycol diacrylate (1.3 g), acetone (12 ml), Michler's ketone, (0.04 mmole), tris(4-dimethylaminophenyl)methane 0.27 mmole), and in composition (A): 4-methyl-4-trichloromethyl-2,5-cyclohexadienone (TMCH; 0.44 mmole); and in composition (B): 2,6-dimethyl-4-(1,3-dichloro-1,1,3,3-tetrafluoroisopropylidene)-2,5-cyclohexadienone (XCH; 0.44 mmole). These compositions are coated, exposed and evaluated as described in Example 5.

Prior to coating it is noted that composition (B) turns a dark violet color indicating extensive thermal oxidation of the leuco dye. Also, the element prepared from composition (B) is not tacky and does not accept toner, indicating that polymerization has occurred before exposure to blue or ultraviolet light. Elements prepared from composition (A) show substantially no premature discoloration and gives photographic responses similar to previously prepared elements of this type described in Example 5. A composition prepared similarly to (B) but from which Michler's ketone is eliminated shows similar premature thermal polymerization and discoloration. These results show that compositions containing the 4-halomethyl cyclohexadienones have better thermal stability than similar compositions containing the 4-alkylidenecyclohexadienones disclosed in U.S. Pat. No. 3,598,592.

I claim:

1. A photoimaging composition comprising an admixture of (A) a cyclohexadienone compound of the formula:

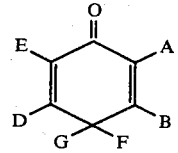

wherein each of A, B, D and E can be hydrogen, an alkyl group of 1 to 9 carbon atoms, bromo, chloro, an aryl group of 6 to 10 carbon atoms, an aralkyl group wherein the aryl moiety is of 6 to 10 carbon atoms and the alkyl moiety is of 1 to 5 carbon atoms, an alkaryl group wherein the aryl moiety is of 6 to 10 carbon atoms and the alkyl moiety is of 1 to 5 carbon atoms, an alkoxy group of 1 to 4 carbon atoms, and A and B and D and E when taken together may form a benzene ring: F is $CCl_3$ or $CHCl_2$; and G can be an alkyl group of 1 to 18 carbon atoms and an aryl group of 6 to 10 carbon atoms; and at least one compound taken from the group consisting of ($B_1$) a leuco dye that is oxidizable to dye by the cyclohexadienone compound; and ($B_2$) an addition polymerizable ethylenically unsaturated monomeric compound.

2. A photoimaging composition according to claim 1 having present at least one leuco dye which has one to two removable hydrogens, the removal of which forms a differently colored compound.

3. A photoimaging composition according to claim 2 wherein the leuco dye is the salt of an acid in leuco form of a triphenylmethane dye having, in at least two of the phenyl rings positioned para to the methane carbon atom, a substituent selected from the group consisting of amino, and $C_1$ to $C_4$ dialkyl amino groups, the acid being a mineral acid, an organic acid, or an acid-supplying compound.

4. A photoimaging composition according to claim 3 wherein at least one film-forming polymeric binder is present.

5. A photoimaging composition according to claim 2 wherein Michler's ketone or derivative thereof is present.

6. A photoimaging composition according to claim 1 wherein the cyclohexadienone compound is 4-methyl-4-trichloromethyl-2,5-cyclohexadienone.

7. A photoimaging composition according to claim 1 wherein the cyclohexadienone compound is 4-dichloromethyl-4-methyl-2,5-cyclohexadienone.

8. A photopolymerizable composition according to claim 1 having present at least one addition polymerizable ethylenically unsaturated compound ($B_2$) having at least one polymerizable ethylenic group.

9. A photopolymerizable composition according to claim 8 wherein Michler's ketone or a derivative thereof is present.

10. A photopolymerizable composition according to claim 8 wherein a leuco dye is present.

11. A photopolymerizable composition according to claim 8 wherein a film-forming polymeric binder is present.

12. A photopolymerizable composition according to claim 8 wherein the cyclohexadienone compound is 4-methyl-4-trichloromethyl-2,5-cyclohexadienone.

13. A photopolymerizable composition according to claim 8 wherein the cyclohexadienone compound is 4-dichloromethyl-4-methyl-2,5-cyclohexadienone.

14. A photoimaging element comprising a support bearing a dry layer of a composition according to claim 1.

15. A photopolymerizable element comprising a support bearing a dry layer of a composition according to claim 8.

16. An element according to claim 15 wherein the support is a film.

17. An element according to claim 15 wherein the support is copper.

* * * * *